United States Patent
Jurisch

(10) Patent No.: US 6,175,810 B1
(45) Date of Patent: Jan. 16, 2001

(54) METHOD OF GENERATING A SIGNAL IDENTIFYING A THREE-POLE SHORT-CIRCUIT OCCURING IN A THREE-PHASE POWER TRANSMISSION LINE

(75) Inventor: Andreas Jurisch, Berlin (DE)

(73) Assignee: Siemens AG, Munich (DE)

( * ) Notice: Under 35 U.S.C. 154(b), the term of this patent shall be extended for 0 days.

(21) Appl. No.: 09/162,041

(22) Filed: Sep. 28, 1998

(30) Foreign Application Priority Data

Sep. 26, 1997 (DE) ............................................. 197 44 009

(51) Int. Cl.[7] ............................. G01R 29/26; H02H 3/00
(52) U.S. Cl. ........................... 702/58; 702/69; 702/72; 324/76.77; 324/86; 361/76; 361/79
(58) Field of Search .................................... 702/58, 64–65, 702/69, 72–73; 324/76.77, 86, 107; 361/76, 79, 80, 85

(56) References Cited

U.S. PATENT DOCUMENTS

| 4,261,038 | * | 4/1981 | Johns et al. ............................. 361/79 |
| 4,333,119 | * | 6/1982 | Schoenmeyer ......................... 361/76 |
| 4,479,160 | * | 10/1984 | Stacey .................................... 324/86 |
| 4,641,088 | * | 2/1987 | Jacobsson .............................. 324/86 |
| 4,795,983 | * | 1/1989 | Crockett et al. ....................... 702/58 |
| 5,224,011 | * | 6/1993 | Yalla et al. ............................. 361/80 |
| 5,378,979 | * | 1/1995 | Lombardi ............................... 324/86 |
| 5,544,089 | * | 8/1996 | Hemminger et al. .................. 702/64 |

* cited by examiner

Primary Examiner—Patrick Assouad
Assistant Examiner—Bryan Bui
(74) Attorney, Agent, or Firm—Kenyon & Kenyon

(57) ABSTRACT

A method for generating a signal identifying a three-pole short-circuit occurring in a three-phase power transmission line in which the phase currents and phase voltages are sampled forming phase current and phase voltage sampling values and the signal is formed from the phase current and phase voltage sampling values. In order to reliably detect three-phase short-circuits with such a method, even during oscillations, a positive phase-sequence system effective power parameter that is proportional to the instantaneous value of the positive phase-sequence system effective power of the power transmission line is formed, from which a grid frequency component parameter and a swing component parameter are then determined. The signal is generated from the grid frequency component parameter and the swing component parameter.

7 Claims, 2 Drawing Sheets

METHOD OF GENERATING A SIGNAL IDENTIFYING A THREE-POLE SHORT-CIRCUIT OCCURING IN A THREE-PHASE POWER TRANSMISSION LINE

FIELD OF THE INVENTION

The present invention relates to a method of generating a signal identifying a three-pole short-circuit occurring in a three-phase power transmission line in which the phase currents and phase voltages are sampled forming phase current and phase voltage sampling values and the signal is formed from the phase current and phase voltage sampling values.

BACKGROUND INFORMATION

The reference "Bedienungshandbuch zum Schutzgerät" (Protection Device Operating Manual), 7SA513 V3.1, Siemens AG, p. 68, describes a method in which phase currents and phase voltages are sampled to forming phase current and phase voltage sampling values. An impedance vector is formed from these sampling values and tested for its rate of change in the complex R-X impedance plane. A signal identifying a three-pole short-circuit is generated if the rate of change of the impedance vector in the R-X impedance plane is excessively high.

SUMMARY OF THE INVENTION

An object of the present invention is to provide a method with which three-pole short-circuits are particularly reliably detected during oscillations.

This object is achieved according to the present invention by forming a positive phase-sequence system effective power parameter proportional to the instantaneous value of the positive phase-sequence system effective power in the power transmission line. The positive phase-sequence system effective power parameter is supplied to a digital filter in which a component of the positive phase-sequence system effective power parameter is determined, exponentially decaying over time and oscillating with grid frequency. The positive phase-sequence system effective power parameter is supplied to a second digital filter where an additional positive phase-sequence system effective power parameter component, exponentially decaying over time, oscillating with grid frequency and orthogonal to the first parameter component, is determined. The positive phase-sequence system effective power parameter is supplied to a third digital filter, where an oscillating positive phase-sequence system component parameter that oscillates over time with a swing frequency is determined, the first and the additional parameter components are squared and added, forming a grid frequency component parameter of the positive phase-sequence system effective power parameter, and the signal is generated with the swing component parameter and the grid frequency component parameter.

An advantage of the method according to the present invention is that three-pole short-circuits can be very reliably detected even during power oscillations, since the swing component and the short-circuit component in the positive phase-sequence system effective power parameter are separated by the use of the digital filter, which allows a particularly reliable detection of three-pole short-circuits in the power transmission line.

In the method according to the present invention, the first signal identifying the three-pole short-circuit is determined from the swing component parameter and the grid frequency component parameter. This can be achieved in a particularly simple and therefore advantageous manner by squaring the swing component parameter, forming a quotient of the grid frequency component parameter and the squared swing component parameter, and generating the signal when the quotient exceeds a predefined threshold value.

The positive phase-sequence system effective power parameter can be formed in a particularly quick and advantageous manner by subjecting the phase current and phase voltage sampled values to an $\alpha\beta$ transform (Clarke transform), forming transformed sampled values and forming the positive phase-sequence system effective power parameter from the transformed sampling values.

Non-recursive filters, for example, are digital filters that can be implemented in a particularly simple manner, so that it is considered advantageous if the first, second and/or third filters are non-recursive (FIR) filters.

In order to determine the three-pole short-circuit, a parameter component, oscillating with grid frequency and decaying exponentially over time, and another parameter component, oscillating with grid frequency and decaying exponentially over time, is formed from the positive phase-sequence system effective power parameter according to the present invention, the first and the second parameter components being orthogonal to one another. These method steps can be executed in a particularly simple manner if one parameter component is sinusoidal and the second parameter component is cosinusoidal.

In order to prevent low-frequency interfering signals in the positive phase-sequence system effective power parameter from affecting the measurement accuracy as the two parameter components are determined, it is considered particularly advantageous if the positive phase-sequence system effective power parameter is subjected to high-pass filtering prior to being supplied to the first and the second filters.

A particularly high measurement accuracy can be achieved in the method according to the present invention if the first and second parameter components are determined by using an optimum filter designed to filter out the signal component $A^*\exp(-t/\tau)^*\sin(\omega t)$ as the first filter, where A is an amplitude, $\tau$ is a constant and $\omega$ is the grid circuit frequency, and by using an optimum filter designed to filter out the signal component $B^*\exp(-t/\tau)^*\cos(\omega t)$ as the second filter, where B is another amplitude.

DETAILED DESCRIPTION

Figure 1:
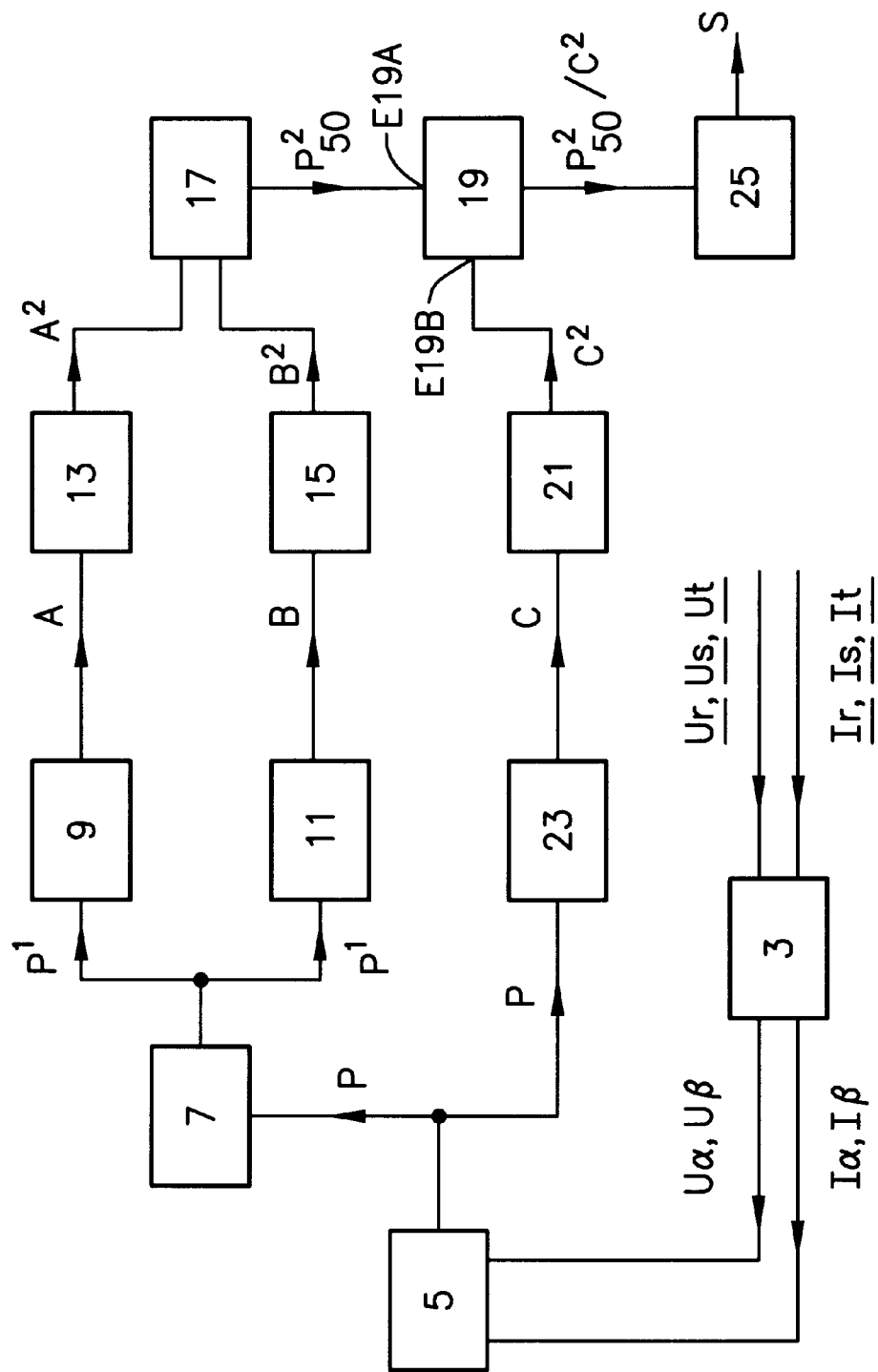
FIG. 1 shows an embodiment of an arrangement for carrying out the method according to the present invention.

FIG. 1 shows a device 3 for space vector formation, whose input is connected to three phases of a three-phase electrical power transmission line via current transformers and voltage transformers (not illustrated). The output of device 3 for space vector formation is connected to a device 5 for positive phase-sequence system effective power parameter formation, whose output is connected to a downstream high-pass filter 7. The output of high-pass filter 7 is connected to a digital filter 9 and a second digital filter 11. A squarer is connected downstream to each of the two filters 9 and 11, one squarer 13 being connected to the first digital filter 9 and the second squarer 15 being connected to the second filter 11. The outputs of the two squarers 13 and 15 are connected to an adder 17, which is connected to a downstream quotient former 19 having an input E19A. Another input E19B of quotient former 19 is connected to an upstream third squarer 21, whose input is connected to the output of a third digital filter 23. This third digital filter 23 is also connected to the output of device 5 for forming a positive phase-sequence system effective power parameter. The output of quotient former 19 is connected to a threshold value comparator 25. A suitable signal S is emitted at the output of threshold value comparator 25 in the case of a three-pole short-circuit in the three-phase electric power transmission line.

With the arrangement according to FIG. 1, signal S can be generated as follows. Initially phase currents I_r, I_s, I_t and phase voltages U_r, U_s, U_t of the three-phase power transmission line (not illustrated) are sampled in space vector forming device 3, forming phase current and phase voltage sampling parameters Ur, Us, Ut, Ir, Is and It. These sampling values are subjected to a Oαβ transform (Clarke transform), which allows transformed current sampling values Iα, Iβ, as well as transformed voltage sampling values Uα, Uβ to be determined (see "Koordinatentransformationen zur Behandling von Mehrphasensystemen" [Coordinate Transforms Used for Multiphase Systems], H.-H. Jahn and R. Kasper, Archiv für Elektrotechnik, 56 (1974), pp. 105–111):

$$I\alpha = \sqrt{\frac{2}{3}} \cdot (Ir - 0,5 \cdot (Is + It)) \quad (1)$$

$$I\beta = \sqrt{\frac{1}{2}} \cdot (Is - It) \quad (2)$$

$$U\alpha = \sqrt{\frac{2}{3}} \cdot (Ur - 0,5 \cdot (Us + Ut)) \quad (3)$$

$$U\beta = \sqrt{\frac{1}{2}} \cdot (Us - Ut) \quad (4)$$

A positive phase-sequence system effective power parameter P, proportional to the instantaneous value of the positive phase-sequence system effective power is formed from these transformed sampling values in positive phase-sequence system effective power parameter forming device 5 according to the following equation:

$$P = \frac{1}{2}(U\alpha \cdot I\alpha + U\beta \cdot I\beta) \quad (5)$$

In the following, it is assumed that, in the case of a short-circuit or grid oscillation, the positive phase-sequence system effective power parameter P has a variation that can be described by the following signal model:

$$P = P1 \cdot \exp(-t/\tau) \cdot \sin(\omega t) + P2 \cdot \exp(-t/\tau) \cdot \cos(\omega t) + C \quad (6)$$

where the first term $P1^* \exp(-t/\tau)^* \sin(\omega t)$ describes a signal component of the positive phase-sequence system effective power parameter P, exponentially decaying over time and oscillating with grid frequency; the second term $P2^* \exp(-t/\tau)^* \cos(\omega t)$ is a second signal component of the positive phase-sequence system effective power parameter P, exponentially decaying over time and oscillating with grid frequency, the first and second signal components being orthogonal to one another, since the second signal component is cosinusoidal. C is a swing component of the positive phase-sequence system effective power parameter P, oscillating with a swing frequency, swing component C being time-independent and thus denoting an instantaneous value.

The signal model of equation (6) assumes that in the case of a three-pole short-circuit virtually no more conversion of effective power, and thus also of positive phase-sequence system effective power, takes place, so that the positive phase-sequence system effective power parameter P must drop to a very small value (near zero) in the case of such a short-circuit. This drop in the positive phase-sequence system effective power parameter is taken into account by the first of the two terms of equation (6). In the signal model of equation (6) power swings are also detected, specifically by the third term, i.e., swing component C. Swing component parameter C takes into account those frequency components of positive phase-sequence system effective power parameter P that are lower than the grid frequency and are therefore characteristic for grid oscillations. Further details concerning the determination of swing component parameter C will be provided in conjunction with the description of the third digital filter 23.

Figure 3:
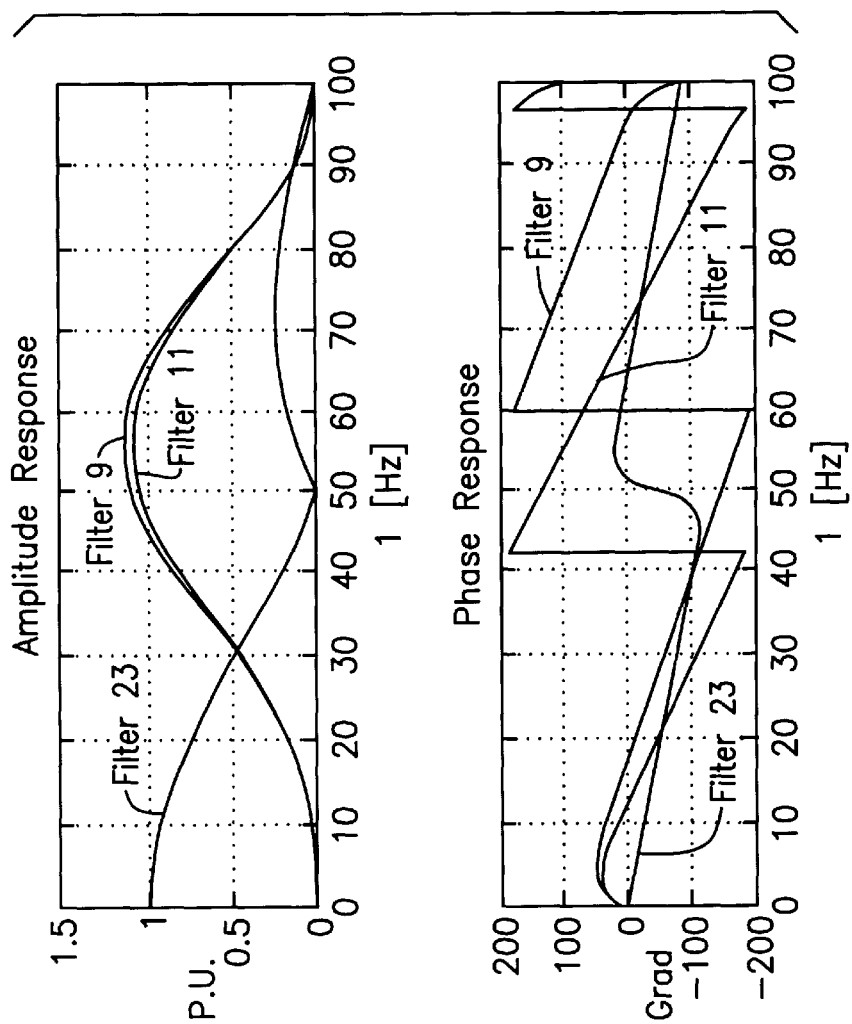
FIG. 3 shows amplitude and phase curves of digital filters in the arrangement according to the present invention illustrated in FIG. 1.

Positive phase-sequence system effective power parameter P is supplied to high-pass filter 7, where the low-frequency components with frequencies below the grid frequency in positive phase-sequence system effective power parameter P are removed by filtering and a filtered positive phase-sequence system effective power parameter P' is formed. This filtered positive phase-sequence system effective power parameter P' goes to first digital filter 9 and second digital filter 11. In first digital filter 9, a parameter component A exponentially decaying over time and oscillating with grid frequency is obtained from filtered positive phase-sequence system effective power parameter P', which component A corresponds to the first term in the signal model of equation (6). First digital filter 9 is designed for this purpose as an optimum filter to filter out signal component $P1^* \exp(-t/\tau)^* \sin(\omega t)$. The design of the optimum filters is described in various references (see, for example, Thomas P. Krauss, Loren Shure, John N. Little, The Math Works Inc. "Signal Processing Toolbox"; Helmut Schwarz, "Optimale Regelung und Filterung" [Optimum Control and Filtering], Akademie-Verlag Berlin, 1981, pp. 100–116; Jürgen Wede and Dietrich Werner, "Echtzeitprozessmodelle auf der Basis von Parameterschatzverfahren" [Real-time Process Models on the Basis of Parameter Estimation Procedures], VEB Verlag Technik Berlin, 1985, pp. 30–35; Jürgen Wernstedt, "Experimentelle Prozessanalyse" [Experimental Process Analyses], VEB Verlag Technik Berlin, 1989). Exemplary embodiments for the three digital filters 9, 11 and 23 according to FIG. 1, are shown in FIG. 3 in the form of amplitude and phase curves. In the second filter 11, another parameter component B, exponentially decaying over time and oscillating with grid frequency, corresponding to the second term of the signal model of equation (6), is determined; for this purpose, second filter 11 is designed as an optimum filter for filtering out the signal component $P2^* \exp(-t/\tau)^* \cos(\omega t)$.

First parameter component A is supplied to a squarer 13, and the additional parameter component B is supplied to the additional squarer 15; the parameter components A and B are squared in squarers 13 and 15, forming first squared parameter component $A^2$ and second squared parameter component $B^2$. The two squared parameters $A^2$ and $B^2$ are supplied to adder 17, in which a grid frequency component parameter $p^2{}_{50}$ of the filtered positive phase-sequence system effective power parameter P', and thus of positive phase-sequence system effective power parameter P is formed by addition. This grid frequency component parameter $P^2{}_{50}$ is sent to quotient former 19.

Positive phase-sequence system effective power parameter P is also transmitted by positive phase-sequence system effective power parameter forming device 5 to third digital filter 23, where a swing component parameter C of positive phase-sequence system effective power parameter P, oscillating at swing frequency over time, is formed. Since the swing frequency is not known in advance, the swing component parameter is specifically determined by the fact that the swing component parameter identifies all those signal components whose frequency is below grid frequency; in other words, it is taken account that oscillations have swing frequencies that are considerably lower than the grid frequency. Third filter 23 is therefore basically a low-pass filter, which only lets through low frequencies, i.e., those that are characteristic of grid oscillations, without damping. The design of third digital filter 23 is also illustrated in FIG. 3. Swing component parameter C is supplied to third squarer 21, where it is squared forming squared swing component parameter $C^2$. Squared swing component parameter $C^2$ is supplied to the second input E19B of quotient former 19.

In quotient former 19, a quotient $P^2{}_{50}/C^2$ is formed from grid frequency component parameter $p^2{}_{50}$ and squared swing component parameter $C^2$, which quotient is forwarded to threshold value comparator 25. In this comparator 25, the quotient $P^2{}_{50}/C^2$ is monitored to detect when it exceeds a predefined threshold value. It the quotient $P^2{}_{50}/C^2$ exceeds a threshold value, for example, 0.25, signal S is generated at the output of threshold value comparator 25, which, as mentioned before, identifies a three-pole short-circuit occurring in the three-phase power transmission line.

If quotient $P^2{}_{50}/C^2$ is less than the threshold value, the swing component parameter C is too large, which indicates that grid oscillation, rather than three-phase short-circuit, has occurred in the power transmission line; in this case no signal S is generated.

Figure 2:
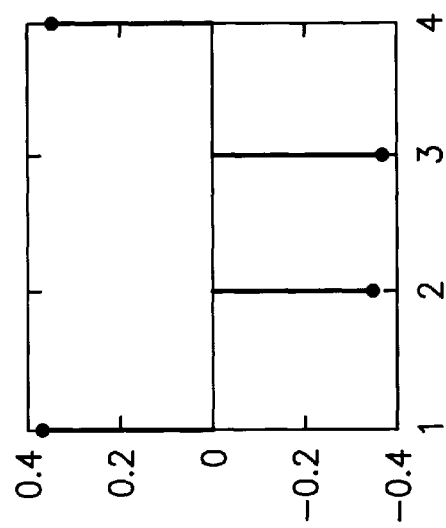
FIG. 2 shows a pulse response of a high-pass filter in the arrangement according to the present invention illustrated in FIG. 1.

FIG. 2 shows an embodiment of high-pass filter 7 in the form of a digital pulse response.

FIG. 3 shows, as explained above, embodiments of first digital filter 9, second digital filter 11, and third digital filter 23 in the form of amplitude and phase curves. The three filters 9, 11, and 23 can be configured as FIR filters; suitable filter coefficients for these filters can be generated, for example, using the known MATLAB® program package (The MathWorks Inc., Natick, Mass., U.S.A.) with the following MATLAB® source data:

```
% calculate the gamma-vectors and S-matrix for the power
swing estimator
N=4;
TA=5e−3;
T=20e−3;
Tau=150e−3;
it=0:TA:(N−1)*TA;
g=[sin(2*pi/T*it).*exp(−it/Tau); cos(2*pi/T*it).*exp(−it/Tau);0*it+1];
gamma=g'
S=inv(g*gl)
a=S(1,1)*g(1,:)+S(1,2)*g(2,:)+S(1,3)*g(3,:);
b=S(2,1)*g(1,:)+S(2,2)*g(2,:)+S(2,3)*g(3,:)
c=S(3,1)*g(1,:)+S(3,2)*g(2,:)+S(3,3)*g(3,:);
a=fliplr(a)
b=fliplr(b)
c=fliplr(c)
c__=c− [0,0.5,0.5,0];
```

```
[C__,f]=freqz(c__,1,512,200);
c__=c__/abs(C__(256));
a__=conv(c__,a);
b__=conv(c__,b);
[C,f]=freqz(c,1,512,200)
[A__,f]=freqz(a__1,512,200);
[B__,f]=freqz(b__1,512,200)
subplot(2,1,1)
plot(f,[abs(C),abs(A__), abs(B__)])
grid
subplot (2,1,2)
plot(f,[angle(C)*180/pi,angle(A__)*180/pi,angle(B__)*180/pi])
grid
delt_phi=(angle(A__(256))−angle(B__(256)))*180/pi
```

The method of generating a signal identifying a three-pole short-circuit occurring in a three-phase power transmission line with the arrangement of FIG. 1 can be implemented in a data processing system, for example.

What is claimed is:

1. A method of generating a signal identifying a three-pole short-circuit occurring in a three-phase power transmission line, comprising the steps of:

sampling phase currents and phase voltages to form phase current sampling values and phase voltage sampling values;

forming a positive phase-sequence system effective power parameter from the phase current sampling values and the phase voltage sampling values, the positive phase-sequence system effective power parameter being proportional to an instantaneous value of a positive phase-sequence system effective power of the power transmission line;

supplying the positive phase-sequence system effective power parameter to a first digital filter;

determining by the first digital filter a first parameter component of the positive phase-sequence system effective power parameter, the first parameter component exponentially decaying over time and oscillating with grid frequency;

supplying the positive phase-sequence system effective power parameter to a second digital filter;

determining by the second digital filter a second parameter component of the positive phase-sequence system effective power parameter, the second parameter component exponentially decaying over time and oscillating with grid frequency and being orthogonal to the first parameter component;

supplying the positive phase-sequence system effective power parameter to a third digital filter;

determining by the third digital filter a swing component parameter of the positive phase-sequence system effective power parameter, the swing component oscillating with a swing frequency over time;

forming a grid frequency component parameter of the positive phase-sequence system effective power parameter, the grid frequency component being formed by squaring the first parameter component and the second parameter component, and adding the squared first parameter component and the squared second parameter component; and generating the signal identifying the three-pole short-circuit as a function of the swing component parameter and the grid frequency component parameter.

2. The method according to claim 1, further comprising the steps of:

squaring the swing component parameter;

forming a quotient from the grid frequency component parameter and the squared swing component parameter; and generating the signal if the quotient exceeds a predefined threshold value.

3. The method according to claim 1, further comprising the steps of:

forming transformed sampling values by applying an $\alpha\beta$ transform to the phase current sampling values and the phase voltage sampling values; and forming the positive phase-sequence system effective power parameter from the transformed sampling values.

4. The method according to claim 1 wherein at least one of the first digital filter, the second digital filter, and the third digital filter includes a non-recursive FIR filter.

5. The method according to claim 1 wherein the first parameter component is sinusoidal and the second parameter component is cosinusoidal.

6. The method according to claim 1, further comprising the step of:

high-pass filtering the positive phase-sequence system effective power parameter prior to supplying the positive phase-sequence system effective power parameter to the first digital filter and the second digital filter.

7. The method according to claim 1, wherein the first digital filter filters out a signal component $A*\exp(-t/\tau)*\sin(\omega t)$, where A is a first amplitude, $\tau$ is a constant, and $\omega$ is the grid frequency, and wherein the second digital filter filters out a signal component $B*\exp(-t/\tau)*\cos(\omega t)$, where B is a second amplitude.

* * * * *